United States Patent
Hawryluk et al.

Patent Number: 5,178,974
Date of Patent: * Jan. 12, 1993

[54] VIRTUALLY DISTORTION-FREE IMAGING SYSTEM FOR LARGE FIELD, HIGH RESOLUTION LITHOGRAPHY USING ELECTRONS, IONS OR OTHER PARTICLE BEAMS

[75] Inventors: Andrew M. Hawryluk, Modesto; Natale M. Ceglio, Livermore, both of Calif.

[73] Assignee: The United States of America as represented by the United States Department of Energy, Washington, D.C.

[*] Notice: The portion of the term of this patent subsequent to Jan. 5, 2010 has been disclaimed.

[21] Appl. No.: 683,011

[22] Filed: Apr. 10, 1991

Related U.S. Application Data

[63] Continuation-in-part of Ser. No. 597,968, Oct. 12, 1990.

[51] Int. Cl.[5] .................. G03B 27/32; G03B 27/68
[52] U.S. Cl. .................................. 430/5; 430/394; 430/396; 355/47; 355/49; 355/52; 355/66
[58] Field of Search ................. 430/5, 394, 396; 355/47, 49, 52, 66

[56] References Cited

U.S. PATENT DOCUMENTS
4,166,694  9/1979  Horning et al. ............... 355/47
4,198,147  4/1980  Alasia .......................... 355/52

FOREIGN PATENT DOCUMENTS
56-69634  6/1981  Japan ........................... 430/5

Primary Examiner—Marion E. McCamish
Assistant Examiner—Kathleen Duda
Attorney, Agent, or Firm—Miguel A. Valdes; Henry P. Sartorio; William R. Moser

[57] ABSTRACT

Virtually distortion free large field high resolution imaging is performed using an imaging system which contains large field distortion or field curvature. A reticle is imaged in one direction through the optical system to form an encoded mask. The encoded mask is then imaged back through the imaging system onto a wafer positioned at the reticle position. Particle beams, including electrons, ions and neutral particles, may be used as well as electromagnetic radiation.

9 Claims, 3 Drawing Sheets

ENCODING PROCESS

DECODING PROCESS

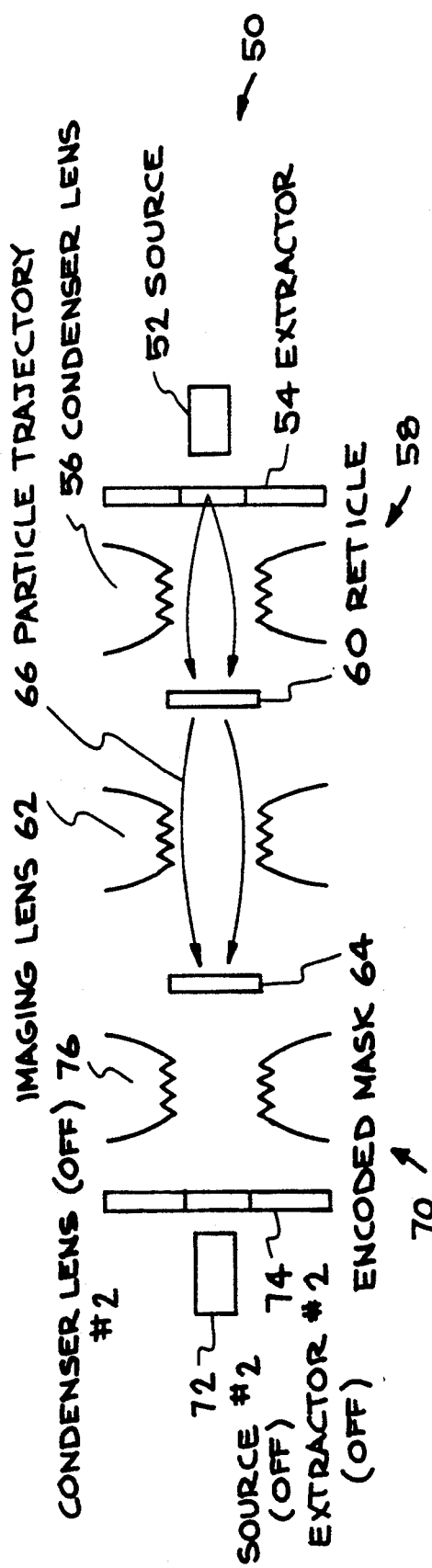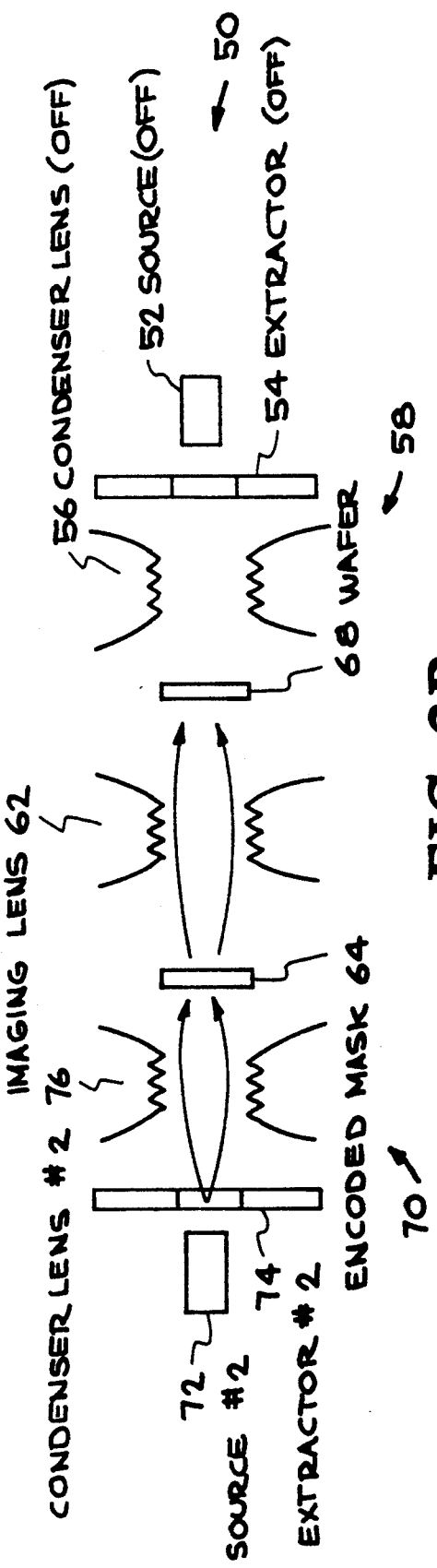
FIG. 3A
FIG. 3B

VIRTUALLY DISTORTION-FREE IMAGING SYSTEM FOR LARGE FIELD, HIGH RESOLUTION LITHOGRAPHY USING ELECTRONS, IONS OR OTHER PARTICLE BEAMS

The United States Government has rights in this invention pursuant to Contract No. W-7405-ENG-48 between the U.S. Department of Energy and the University of California, for the operation of Lawrence Livermore National Laboratory.

RELATED APPLICATION

This application is a continuation-in-part of application Ser. No. 07/597,968 filed Oct. 12, 1990 pending.

BACKGROUND OF THE INVENTION

The invention relates to a simple projection imaging technique and apparatus, suitable for use with all forms of radiation such as visible, deep ultraviolet (UV) and x-rays, and with all particles, such as electrons, ions and neutral species, and particularly suitable for the replication (i.e., "lithography") of high density integrated circuit patterns. The invention particularly relates to reduction or elimination of distortion problems in large field, high resolution lithography.

A number of different lithographic techniques are presently used for semiconductor microcircuit manufacturing. For example, visible and UV radiation are used in conventional steppers to transfer a pattern from a master reticle to a wafer. This process uses projection optics and often demagnifies the image of the master pattern onto the wafer. To obtain a large, nearly distortion-free image field (the maximum allowable distortion in the image is typically required to be less than one tenth of the minimum linewidth in the entire field) with high spatial resolution, complex imaging systems are needed. These systems often use more than two optical elements and more than one aspheric optical element. Current commercial systems have a spatial resolution (i.e., can image a minimum linewidth) of approximately 0.5 microns and expose fields of approximately 25 mm in diameter. Due to fundamental physical constraints, this process operating at wavelengths greater than 190 nm will be unable to produce circuits with minimum feature sizes much smaller than approximately 0.2 microns.

In proximity print x-ray lithography (PPXRL), e.g., as described by A. Heuberger, J. Vac. Sci. Tech., B6, 107 (1988), a mask and wafer are placed in "near contact" to one another and the pattern on the mask is replicated onto the wafer by "shadow-casting". The mask is fabricated on a thin (less than 5 micron thick) membrane, is difficult to manufacture and is subject to distortion. Because of diffraction, PPXRL may not be able to achieve very high resolution (i.e., PPXRL may be limited to linewidths greater than 0.2 micron).

Soft x-ray projection lithography (SXPL), e.g., as described by A. M. Hawryluk and L. G. Seppala, J. Vac. Sci. Tech., B6, 2162 (1988) and in U.S. patent application Ser. No. 308,332 filed Feb. 9, 1989 by A. M. Hawryluk and L. G. Seppala, has been shown to be capable of very high resolution (e.g., minimum feature size down to 0.05 microns or less), but requires a totally reflective imaging system. A reflective imaging system requires a multi-element, aspheric optical imaging system to achieve large flat fields (greater than 25 mm in diameter) with low distortion. This optical system requires very precise components which have yet to be developed. An alternative to this complex reflective imaging system utilizes an imaging system with all spherical reflective components. The advantage of this system is the ease of fabrication of spherical optics (relative to aspherical optics), but the disadvantage is the introduction of field curvature and distortion to the imaging system. Field curvature in the spherical imaging system can be eliminated with the appropriate mask curvature, and field distortion can be eliminated by patterning the curved mask in a manner that exactly compensates the distortion in the imaging system. For this approach to work, precise spherical optical imaging elements and apriori knowledge of the field distortion are required. In addition, mask patterning, repair and inspection techniques on curved substrates have to be developed.

In present day microcircuit mass production, conventional visible and UV lithography is used to image or shadow-cast a master pattern (the reticle) onto a wafer. The process takes a precise, flat reticle and transports the image through a precise optical system (i.e., the optical transport system is nearly distortion free) to produce the desired pattern on the flat wafer. The requirement that the optical transport system be nearly distortion free and have a flat field (at both the reticle and the wafer) greatly increases the complexity of conventional lithographic tools.

Particle beam projection lithography, particularly with election and ion beams, is also being explored; however, many of the same problems are encountered. For example, in both electron and ion beam projection lithography for integrated circuit manufacturing, it is difficult to achieve large, distortion free image fields simultaneously with high resolution.

SUMMARY OF THE INVENTION

Accordingly it is an object of the invention to provide method and apparatus for substantially distortion free lithography.

It is also an object of the invention to provide virtually distortion free replication without requiring the imaging optics to be distortion free.

It is another object of the invention to perform distortion free lithography utilizing imaging optics with little or no coma, astigmatism or spherical aberrations but which may contain large field distortion or field curvature.

It is a further object of the invention to provide virtually distortion free, large field, high resolution imaging.

It is also an object of the the invention to provide method and apparatus for substantially distortion free lithography using electron, ion and other particle beams.

The invention is a lithography system, including method and apparatus, which corrects for its own distortion and produces a virtually distortion-free replication of an original reticle on a wafer. This Distortion Free Lithography (DFL) uses relatively simple reflection optics. In principle, a DFL system based on transmission optics can also be designed. The DFL based on reflection optics may be used with any radiation for which mirrors exist (i.e., soft x-rays, through deep UV, visible, infrared, etc.), and can be used to expose large fields (greater than 25 mm diameter) with very high resolution. Because it is a reflection system, the DFL system is achromatic and provides flexibility for the use of multiple wavelengths for different processes. For example, mask to wafer alignment can be accomplished at one wavelength, whereas, lithographic exposure can be at a second wavelength.

In the DFL according to the invention an encoding technique is used to fabricate an intermediate mask (the "encoded mask") from the original reticle. This encoded mask records the original reticle pattern as well as all the optical distortion produced by the imaging system. The encoded mask is then processed into a patterned reflecting mask. The patterned reflecting encoded mask is placed back into the imaging system and is imaged back ("played backwards") through the imaging system over the same path in the reverse direction from that used for encoding the mask to produce low distortion or distortion free images of the reticle onto the wafer.

The virtually distortion-free imaging (VDFI) technique can be generalized to include imaging techniques using particles, such as electrons, ions or neutral species. Using the distortion free imaging technique, one can generate an encoded mask from a reticle and produce a high resolution distortion free replica of the reticle onto a wafer using particle beams.

BRIEF DESCRIPTION OF THE DRAWINGS

In the accompanying drawings:

FIGS. 3A, 3B are schematic views of a VDFI system using particles, showing the encoding and decoding processes, respectively.

DETAILED DESCRIPTION OF THE PREFERRED EMBODIMENTS

Figure 1:
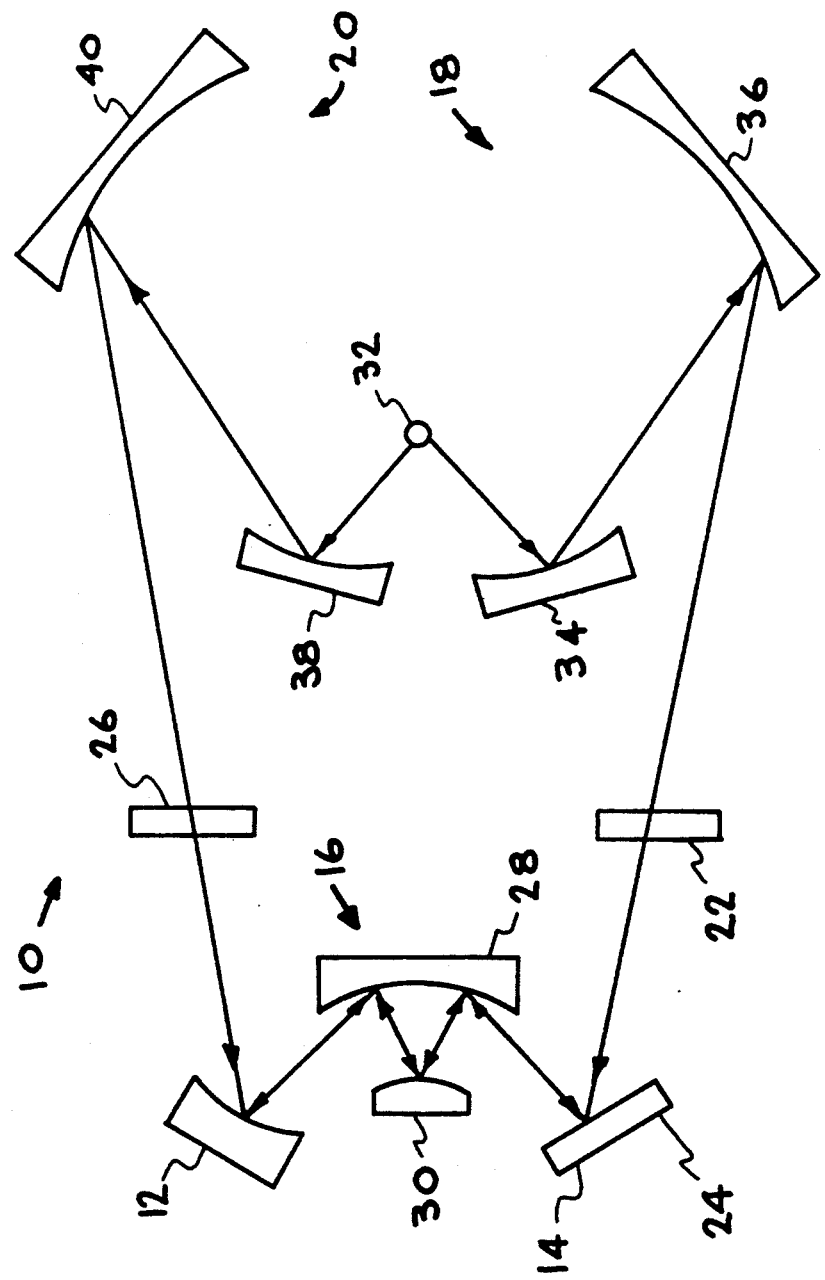
FIG. 1 is a schematic view of a virtually distortion-free imaging (VDFI) system for lithography.

The method and apparatus according to the invention for producing substantially distortion free replication of an original mask (reticle) on a wafer by self-correction of distortion produced by the imaging optics is illustrated in FIG. 1. An encoding and replication system 10 is used to make an encoded mask 12 from the original reticle 14. The encoding and replication system 10 is formed of an imaging means or system (imaging optics) 16 with two condenser systems 18, 20. A variety of different imaging means 16 can be used in the encoding process, but it is preferable that the imaging optics have insignificant coma, astigmatism or spherical aberrations. However, large field distortion or field curvature would be permissible. The imaging means can be magnifying or demagnifying, or a 1:1 imaging system. As shown, imaging means 16 is formed of a pair of spaced aligned reflective elements 28, 30 (element 28 is a concave reflector and element 30 is a convex reflector).

The first step of the process is to make the encoded version of the original reticle 14. The prepatterned pre-encoded mask 12 is reflective at the wavelength used (i.e., a mirror), and is coated with a radiation sensitive material, such as photoresist. The reticle 14 is placed in alignment with the imaging optics 16 and shutter 22 is opened. Radiation from source 32 passes through condenser system 18 which is formed of a pair of spaced aligned reflectors 34, 36 and directed through shutter 22 onto reticle 14. Radiation reflected from reticle 14 passes through imaging means 16 onto the encoded mask 12. The image of the reticle 14 is recorded on the photoresist coated encoded mask 12. This image will include the distortion of the optical imaging means 16. For flat field to flat field imaging systems, the encoded mask will be flat. For flat field to curved field imaging systems, the encoded mask will be appropriately curved to record the focused image of the reticle.

The second step of the process is to pattern the reflecting encoded mask 12. This is generally done by transferring the pattern recorded in the photoresist into or onto the reflecting encoded mask. There are a number of different techniques that can be used for this process, including etching, metalization, etc. This produces a patterned, reflecting encoded mask.

The third step of the process is to image the encoded mask 12 onto the wafer 24. The encoded mask 12 is placed back in its original precise position in alignment with imaging means 16 (after the processing of step two, above). The reticle 14 is removed from the imaging system and is replaced with a flat wafer 24 in the same precise position. The encoded mask 12 is now illuminated by opening shutter 26 (Shutter 22 is now closed). The radiation from source 32 passes through condenser system 20 which is formed of a pair of spaced reflective elements 38, 40, and through open shutter 26 onto encoded mask 12 and back through imaging means 16 onto wafer 24. The pattern from the encoded mask 12 is thus imaged onto the wafer 24. The third step is performed over the identical imaging path through imaging optics 16 between reticle 14/wafer 24 and mask 12, as in the first step, but in the reverse direction. The illumination on the encoded mask 12 is arranged to be a replica (in the reverse direction) of that which would be reflected off the encoded mask in the first step, if it were only reflecting and not coated with photoresist, so that by optical reversibility, the pattern on the wafer 24 is identical to the original pattern on the reticle 14 without the field distortion normally associated with the optical imaging means 16. The normal field distortion is eliminated because the encoded mask 12 was recorded through the optical system in one direction and "played-back" through the optical system along the identical path in the opposite direction. Once the encoded mask 12 is fabricated, the reticle 14 need never be placed back into the optical encoding and replication system 10 (except perhaps to verify alignment). The encoded mask 12 now functions as the reticle 14 in a typical lithographic tool and can be used any number of times.

The invention can be carried out using radiation of virtually any wavelength, including soft x-rays, ultraviolet, visible and infrared, by using a suitable source and optical components. The invention can also be carried out using virtually all particles, including electrons, ions, and neutral species.

Figure 2A:
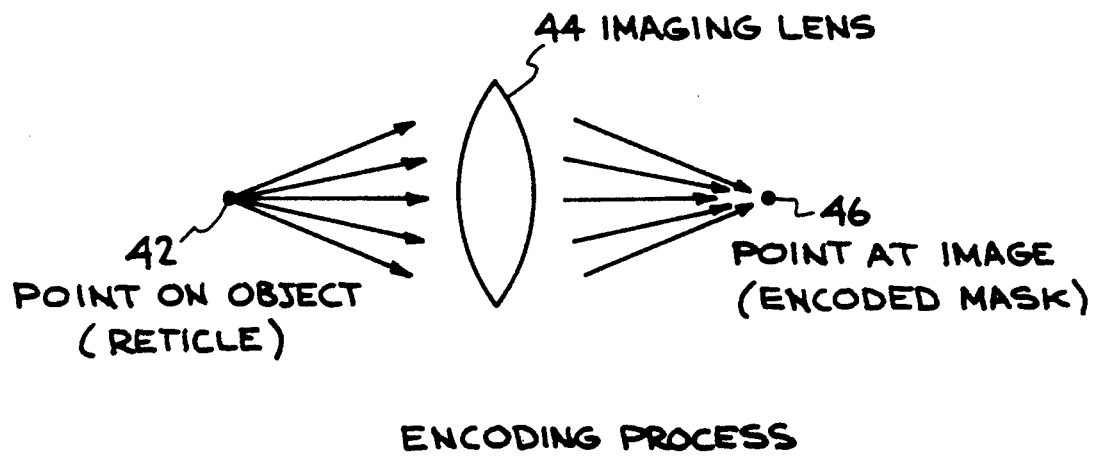
FIGS. 2A, 2B schematically illustrate imaging system illumination for encoding and decoding, respectively.
Figure 2B:
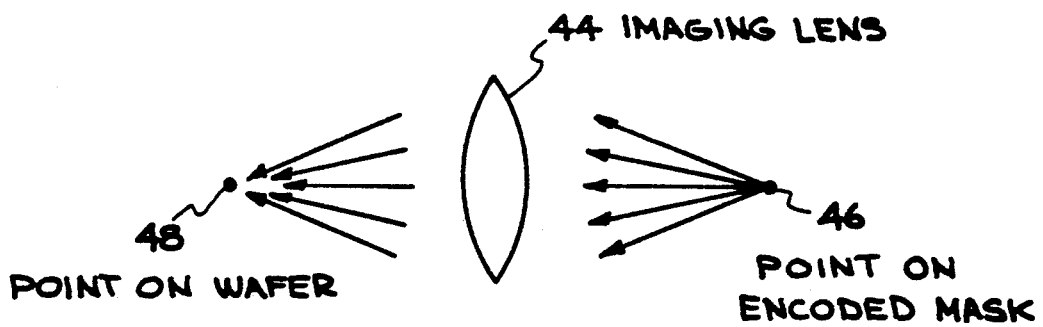

The key to virtually distortion-free imaging (VDFI) using either radiation or particles is the proper illumination for the imaging system, during encoding and decoding, as illustrated in FIGS. 2A, 2B. In FIG. 2A a point 42 at the object (the reticle) illuminates an imaging lens 44 to produce a high resolution image (point 46) at the image plane (which is recorded on the encoder). If one now "turns-around" the ray-paths from the encoder, as shown in FIG. 2B, the imaging system (lens 44) will produce a high resolution image of the point 46 on the encoder at the new image plane (point 48) which is a point on the wafer. In this system the "ray-paths" can imply either electromagnetic radiation or particles. This technique will work equally well for both reflection and transmission imaging systems. The only requirement is that the imaging system does not introduce significant wavefront errors in the form of spherical aberrations, coma or astigmatism. The resolution of the VDFI technique will be limited by these aberrations. In addition, the shape of the encoder mask will be the shape of the field curvature for the imaging system. For an imaging system without field curvature, the encoder will be flat.

The encoding and decoding process for VDFI with particles is illustrated in FIGS. 3A, 3B respectively, which show an encoding and replication system 50. In the encoding process, FIG. 3A, particles (such as ions or electrons) are generated in a source 52 and are extracted from the source 52 by extractor 54 (generally by using an electric field, but VDFI is independent of the source generation and extraction technique). The particles from the source 52 are collected and directed onto the reticle 60 by a condenser lens 56. Source 52, extractor 54 and condenser lens 56 are components of particle beam forming means 58 which is aligned with reticle 60 and imaging lens 62 to image reticle 60 onto encoded mask 64. Generally, the reticle 60 will be used in transmission, and the particles that travel (along paths or trajectories 66) through the imaging lens 62 are imaged onto the encoded mask 64 to form a high resolution, distortion free image. Suitable electrostatic or electrogenetic lenses may be used.

At this point, the encoded mask 64 can be removed from the imaging system 50 for processing (i.e., to make a transmission encoded mask if necessary). After processing, decoding is achieved, as shown in FIG. 3B, by returning the encoding mask 64 to the imaging system 50 and illuminating it using particle beam forming means 70 which includes source 72, extractor 74 and condenser lens 76. A high resolution, distortion free image of the original reticle is now replicated on the wafer 68, which replaces reticle 60. During encoding particle beam forming means 58 is on while particle beam forming means 70 is off; during decoding means 58 is off and means 70 is on. Particle beam forming means 70 is aligned with encoded mask 64 and imaging lens 62 so that mask 64 is imaged back in wafer 68 over the same path used for encoding mask 64 from reticle 60.

This technique will work for many combinations of sources, extractors and condenser lenses and is not limited to the simple example illustrated in FIGS. 3A, B. The encoded mask can be a magnified, demagnified or unity magnified replication of the original reticle.

The invention produces distortion free replications of a reticle pattern using a high resolution imaging system, which has insignificant point aberrations (i.e. spherical aberrations, coma, astigmatism), but may have significant distortion and field curvature over the field of interest.

The features and advantages of the system according to the invention include the following:

1. The VDFI technique produces virtually distortion free replications of an original pattern (the reticle) over a large field of view.

2. The VDFI technique produces high resolution replications.

3. The encoding technique may use reflective or transmissive optics.

4. The VDFI technique can be used with particles, such as electrons, ions or neutrals, as well as with electromagnetic radiation of any wavelength range where optics exist.

5. The VDFI technique can use simple imaging systems with large distortion (distortion much greater than a minimum linewidth) and still produce distortion free replications of the reticle.

6. The VDFI technique can use simple imaging systems with large field curvature (field curvature much greater than the depth of focus of the imaging system) and still produce distortion free replications of the reticle.

7. The VDFI technique can be used with a magnifying, demagnifying, or 1:1 imaging system.

8. The encoded mask can be either flat or curved.

9. The encoded mask can be reused many times.

10. The number of imaging or lensing elements in the imaging system will depend on the specific design chosen. In principle, the system could use a single imaging element (or lens) or it could use two or more imaging elements. The specific design criteria is that the imaging system chosen must have insignificant point aberrations over the large field of interest.

Changes and modifications in the specifically described embodiments can be carried out without departing from the scope of the invention which is intended to be limited only by the scope of the appended claims.

We claim:

1. A method for substantially distortion-free imaging of a reticle onto a wafer, comprising:
   imaging the reticle onto an encodable mask through a distortion producing imaging system in one direction;
   patterning the reticle image onto the encodable mask to form an encoded mask;
   replacing the reticle with a wafer at the same position;
   imaging the encoded mask back through the distortion producing imaging system in the opposite direction onto the wafer;
   wherein the steps of imaging the reticle and mask are performed using illumination beams selected from particle beams and electromagnetic radiation beams.

2. The method of claim 1 further comprising forming the imaging system with substantially no coma, astigmatism and spherical aberrations.

3. The method of claim 1 wherein the imaging system has substantial field distortion and/or field curvature.

4. The method of claim 1 wherein the step of imaging the encoded mask onto the wafer comprises directing an illumination beam reflected from or transmitted through the encoded mask back through the imaging system along the same path but in the opposite direction as the direction used to encode the mask.

5. The method of claim 1 wherein the encoded mask is flat for flat field to flat field imaging systems.

6. The method of claim 1 wherein the encoded mask is curved for flat field to curved field imaging systems.

7. The method of claim 1 further comprising imaging the reticle over a wide field of view.

8. The method of claim 1 further comprising illuminating the reticle to produce a high resolution image of the reticle on the encodable mask.

9. The method of claim 1 further comprising illuminating the encoded mask to produce a high resolution image of the mask on the wafer.

* * * * *